(12) United States Patent
Wu (10) Patent No.: US 10,506,679 B2
(45) Date of Patent: Dec. 10, 2019

(54) LED LIGHT AND ELECTRONIC CANDLE

(71) Applicants: Lu-Kan Wang, Taipei (TW); Sheng Wu, Fuyang (CN); Qianglian Liu, Nanyang (CN)

(72) Inventor: Sheng Wu, Fuyang (CN)

(73) Assignees: Lu-Kan Wang, Taipei (TW); Sheng Wu, Fuyang (CN); Qianglian Liu, Nanyang (CN)

( * ) Notice: Subject to any disclaimer, the term of this patent is extended or adjusted under 35 U.S.C. 154(b) by 0 days.

(21) Appl. No.: 16/212,715

(22) Filed: Dec. 7, 2018

(65) Prior Publication Data

US 2019/0350058 A1    Nov. 14, 2019

(30) Foreign Application Priority Data

May 10, 2018    (CN) .......................... 2018 1 0443545

(51) Int. Cl.
| | | |
|---|---|---|
| *H05B 33/00* | (2006.01) | |
| *H05B 33/08* | (2006.01) | |
| *F21S 9/02* | (2006.01) | |
| *F21S 10/04* | (2006.01) | |
| *H01L 33/56* | (2010.01) | |
| *H01L 33/50* | (2010.01) | |
| *F21W 121/00* | (2006.01) | |
| *F21Y 115/10* | (2016.01) | |

(52) U.S. Cl.
CPC ............ *H05B 33/0845* (2013.01); *F21S 9/02* (2013.01); *F21S 10/04* (2013.01); *H01L 33/502* (2013.01); *H01L 33/56* (2013.01); *F21W 2121/00* (2013.01); *F21Y 2115/10* (2016.08)

(58) Field of Classification Search
CPC ............ H05B 33/0845; H05B 37/0272; H05B 37/0281
See application file for complete search history.

(56) References Cited

U.S. PATENT DOCUMENTS

2014/0286024 A1*   9/2014  Li ........................... F21S 10/04
                                                                362/392

FOREIGN PATENT DOCUMENTS

CN            208154357 U       11/2018

\* cited by examiner

*Primary Examiner* — Monica C King
(74) *Attorney, Agent, or Firm* — Gokalp Bayramoglu (57) ABSTRACT

The present invention belongs to the technical field of decorative lights, and discloses an LED light and an electronic candle. The LED light includes: an encapsulant body having a light condensing surface; at least two light-emitting dies packaged in the encapsulant body and spaced apart from each other, wherein, light emitted by the at least two light-emitting dies as a whole is emitted from the light condensing surface of the encapsulant body; and a dimming control circuit, outputting a varying dimming current to the at least two light-emitting dies according to dimming control signals, the dimming control signals corresponding to the at least two light-emitting dies are different, and the effect of simulated flame swing can be realized by a single LED light. The electronic candle includes the LED light, and the electronic candle has the characteristics of good simulation effect, reasonable structure setting and low production cost.

18 Claims, 6 Drawing Sheets

LED LIGHT AND ELECTRONIC CANDLE

CROSS REFERENCE TO RELATED APPLICATIONS

This application is based upon and claims priority to Chinese Patent Application No. 201810443545.8, filed on May 10, 2018, the entire contents of which are incorporated herein by reference.

TECHNICAL FIELD

The present invention belongs to the technical field of decorative lighting, and specifically relates to an LED light and an electronic candle.

BACKGROUND

In the prior art, although a candle equipped with an electronic control circuit has been provided to realize the function of energy conservation and environmental protection, the existing electronic candles have no effect of wick swing, and cannot satisfy the user experience well. Therefore, an electronic candle capable of simulating the wick swing is produced to overcome the drawbacks. However, the electronic candle capable of simulating the wick swing needs three LED lights and converging and matching multiple beams of light to realize the effect of the simulation of the wick, which increases production costs.

Referring to the Chinese patent application No. 201820698792.8, the document discloses an LED light and an illuminating light device capable of realizing LED simulated flame swing, but the rationality of the structure setting of the LED light and the illuminating light device needs to be improved.

SUMMARY

In order to solve the above problems existing in the prior art, the objective of the present invention is to provide an LED light, and realizing the effect of simulated flame swing by a single LED light.

A further objective of the present invention is to provide an electronic candle which has the characteristics of good simulation effect, reasonable structure setting and low production cost.

The technical solution adopted by the present invention is:

An LED light provided by the present application includes:

an encapsulant body having a light condensing surface;

at least two illuminating dies packaged in the encapsulant body and spaced apart from each other, wherein, light emitted by the at least two light-emitting dies as a whole is emitted from the light condensing surface of the encapsulant body; and a dimming control circuit, wherein the dimming control circuit outputs a varying dimming current to the at least two illuminating dies according to a dimming control signal respectively, and the dimming control signals corresponding to the at least two light-emitting dies are different.

Preferably, the dimming control signal is a periodic control signal; wherein, the dimming control signal is an irregular dimming control signal during a period thereof; or, the dimming control signal is a regular dimming control signal during a period thereof.

Preferably, the vertical distance of each of the light-emitting die from the top end of the light condensing surface is equal.

An electronic candle of the present invention includes the LED light discussed above.

Preferably, the electronic candle further includes:

a housing, having an opening at the top end, wherein a cantilever is fixed in the opening of the housing;

a wick member, wherein a swing connection structure and a limiting structure are respectively disposed between the wick member and the cantilever, the swing connection structure includes a concave portion and a convex portion disposed in the concave portion, and the wick member swings within a range limited by the limiting structure; and the LED light is fixed within the opening of the housing, and light emitted by the LED light is at least partially focused by the wick member.

Preferably, the wick member further includes:

a flame piece, the light emitted by the LED light is at least partially focused by the flame piece; and a counterbalance member fixedly connected to the bottom end of the flame piece, wherein the swing connection structure and the limiting structure are disposed between the counterbalance member and the cantilever.

Preferably, the counterbalance member has an accommodating cavity, and a side wall of the accommodating cavity is provided with a through hole for the cantilever to insert into the accommodating cavity. The through hole constitutes the limiting structure, and one of the accommodating cavity and the cantilever is provided with the convex portion, and the other is provided with the concave portion.

Preferably, an electromagnetic coil is fixed in the housing, and the electromagnetic coil is connected with a magnetic field control circuit to cause the electromagnetic coil to generate a magnetic field at intervals; and the bottom end of the counterbalance member is fixed with a magnet corresponding to the electromagnetic coil.

Preferably, the bottom end of the housing is connected to a supporting rod in a detachable manner.

Preferably, a base is fixed on a bottom of the supporting rod, and the base has a battery accommodating cavity. A battery for respectively supplying power to the dimming control circuit and the magnetic field control circuit is provided in the battery accommodating cavity.

Compared with the prior art, the beneficial effects of the present invention are:

(1) In the LED light of the present invention, at least two light-emitting dies are packaged in the encapsulant body, and the two light-emitting dies are spaced apart from each other. During operation, the at least two light-emitting dies may emit dim and bright lights alternately. Moreover, the dimming control signals corresponding to the at least two of the light-emitting dies are different. Therefore, the light emitted by at least two of the light-emitting dies is different in the situation of alternating dim and bright light. The LED light can exhibit a simulated swinging flame effect, the swinging and flickering effects are not stiff, and the swinging effect is more realistic.

(2) The electronic candle of the present invention prevents the swinging angle of the wick member from being very large which prevents the deviation of the wick member from the illumination area of the LED light by setting a limiting structure between the wick member and the cantilever. Moreover, the limiting structure may also prevent the wick member from colliding with other components, thus, preventing the wick member from rebounding or stopping and avoiding unnatural swinging of the wick member.

(3) The electronic candle of the present invention fixes the counterbalance member at the bottom of the flame piece, so that the center of gravity of the wick member is always on the counterbalance member regardless of how the flame piece swings. Therefore, the wick member will not be stuck or moved.

(4) The electronic candle of the present invention controls the swing of the flame piece by setting the electromagnetic coil and the magnet, so that the simulation effect of the flame piece is more realistic.

(5) The electronic candle of the present invention facilitates the installation of the LED light and the electromagnetic coil by connecting the supporting rods in the housing in a detachable manner.

(6) In the electronic candle of the present invention, the base is fixedly connected to the bottom of the supporting rod, thus the contact area of the base with the platform on which the electronic candle is placed is increased to prevent the electronic candle from falling over.

BRIEF DESCRIPTION OF THE DRAWINGS

In order to illustrate the technical solution of the present invention more clearly, the drawings need to be used in the description of the embodiments will be briefly described below. It should be understood that the drawings in the following description are some embodiments of the present invention, and other drawings may be obtained by those skilled in the art without any creative effort.

DETAILED DESCRIPTION OF THE EMBODIMENTS

The present invention will be further explained below in conjunction with the accompanying drawings and specific embodiments.

Embodiment 1

Figure 1:
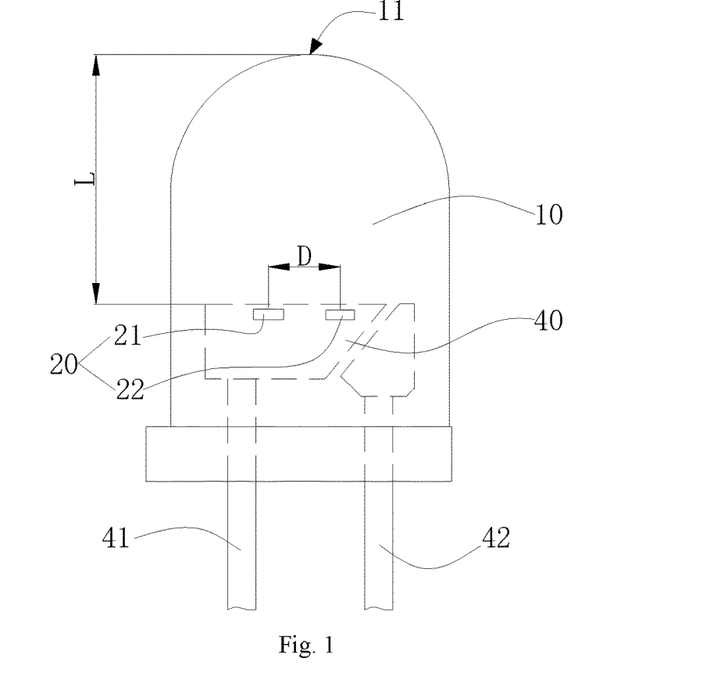
FIG. 1 is a schematic structural diagram of an LED light of the present invention.

Referring to FIG. 1, which is a schematic structural diagram of an LED light of an embodiment of the present invention. The LED light includes encapsulant body 10, at least two light-emitting dies 20 and dimming control circuit 30. In the present embodiment, the number of the light-emitting dies 20 is two. It should be understood that three or more light-emitting dies are correspondingly applicable to the present invention, and are not limited herein.

It can be understood that, in order to facilitate the package of the light-emitting dies 20, the number of light-emitting dies 20 are preferably not more than three, but it is not limited to be no more than three. Taking two light-emitting dies as an example, the two light-emitting dies may be a first light-emitting die 21 and a second light-emitting die 22. The first light-emitting die 21 and the second light-emitting die 22 may be the same standard type of light-emitting dies, or may be different types of light-emitting dies. In order to make the simulation effect more realistic, in the present embodiment, the first light-emitting die 21 and the second light-emitting die 22 have the same standard type, for example, the size may be 10×16 mil.

The encapsulant body 10 may be a structure of the encapsulant body of conventional LED light bead. When moulding the LED light, the light-emitting dies may be packaged in the encapsulant body by a conventional packaging method of the LED, for example, epoxy resin may be used for packaging.

Referring to FIG. 1, the top surface of the encapsulant body 10 is a light condensing surface 11, such as spherical surface or ellipsoidal surface, which is not limited herein. The light emitted by the first light-emitting die 21 and the second light-emitting die 22 may be output from the light condensing surface 11 and concentrated by the light condensing surface 11.

A cup holder 40 is arranged in the encapsulant body 10, and the first light-emitting die 21 and the second light-emitting die 22 are spaced apart from each other and fixed in the rim of the cup holder 40, and then the phosphor is used to prepare the color of the required output light. For example, the color may be selected from various colors such as white, yellow, blue, etc., or the colors of the required output light emitted by the first light-emitting die 21 and the second light-emitting die 22 may be prepared by the phosphor, respectively. Thereby, the simulated flame effects of various colors or mixture of the various colors may be obtained.

Two pins 41, 42 extend from the cup holder 40 and the two pins 41, 42 may be connected to a battery. The battery may supply power to the first light-emitting die 21 and the second light-emitting die 22.

The dimming control circuit 30 may be packaged in the encapsulant body 10, or may also be provided separately and not packaged in the encapsulant body 10, which is not limited herein.

Figure 2:
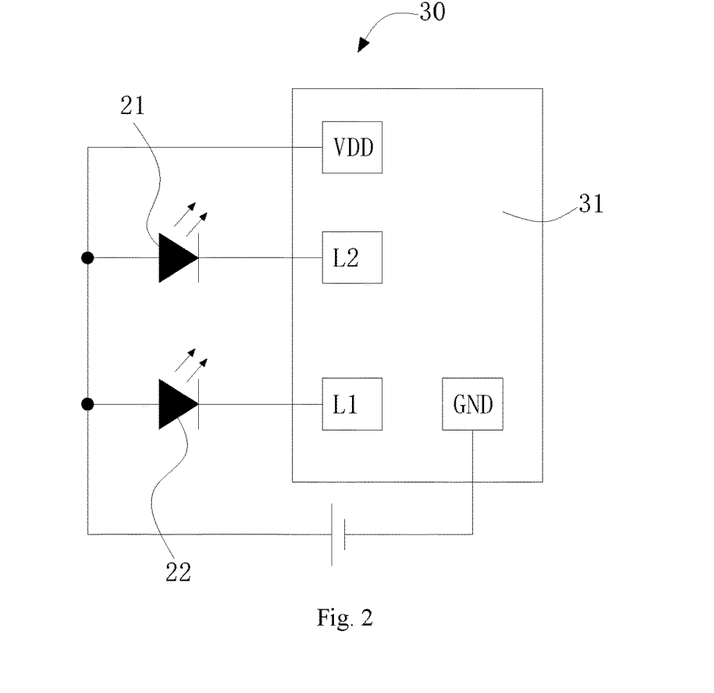
FIG. 2 is a circuit schematic diagram of a dimming control circuit of the embodiment of the LED light shown in FIG. 1.

As shown in FIG. 2, the dimming control circuit 30 may include a first control chip 31, and the first control chip 31 is electrically connected to the first light-emitting die 21 and the second light-emitting die 22, respectively. The dimming control circuit 30 respectively outputs the varying dimming current to the first light-emitting die 21 and the second light-emitting die 22 according to the dimming control signal, so that the first light-emitting die 21 and the second light-emitting die 22 may emit light having a bright and dark change.

The number of first control chips 31 may be one or more. When the number of the first control chip 31 is one, the pins of the first control chip 31 may be connected to the first light-emitting die 1 and the second light-emitting die 22 by wires. When the control chips are more than one, the number of the control chips may be the same as the number of the light-emitting dies, and each of the first control chips 31 is connected to a light-emitting die. In this embodiment, the number of the first control chips 31 is one.

The dimming control signal corresponding to the first light-emitting die 21 is different from the dimming control signal corresponding to the second light-emitting die 22, so the bright and dark change of the first light-emitting die 21 is different from that of the second light-emitting die 22. The first light-emitting die 21 and the second illuminating crystal unit 22 both have the highest brightness and the lowest brightness. The highest brightness and/or the lowest brightness of the first light-emitting die 21 and the second light-emitting die 22 may be the same or may not be the same.

Figure 7:
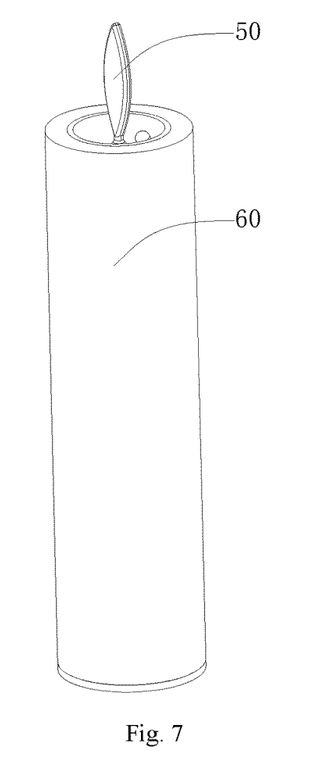
FIG. 7 is a schematic structural diagram of an electronic candle of the present invention.
Figure 8:
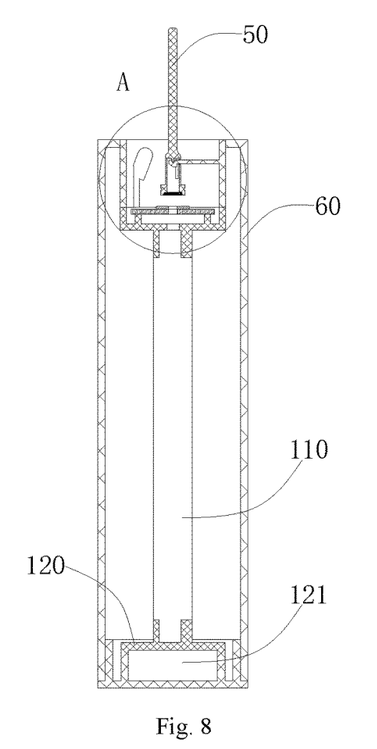
FIG. 8 is a cross-sectional diagram of the electronic candle shown in FIG. 7.
Figure 9:
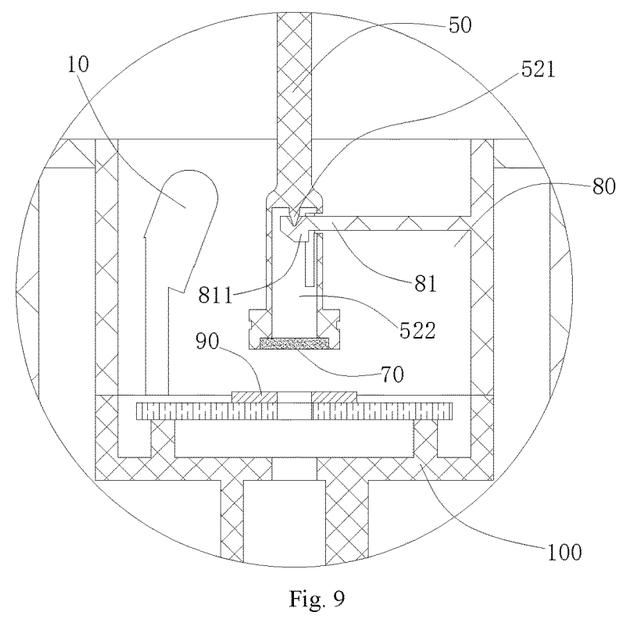
FIG. 9 is an enlarged schematic structural diagram of the area A in FIG. 8.
Figure 11:
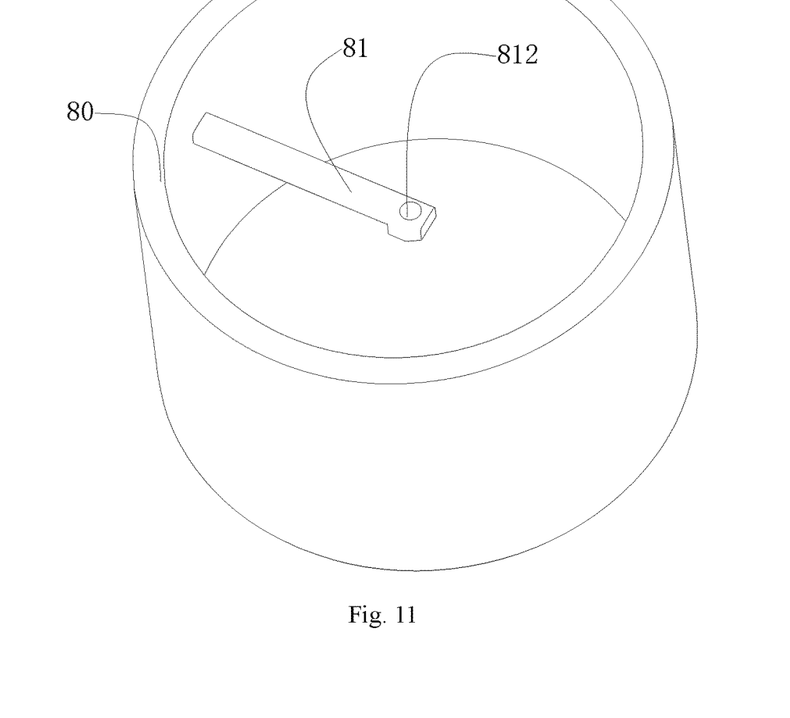
FIG. 11 is a schematic structural diagram showing the structure of the housing in the electronic candle shown in FIG. 7.

Referring to FIG. 7, FIG. 7 is a schematic structural image of an embodiment of an electronic candle of the present invention. FIG. 8 is a cross-sectional view of the electronic candle shown in FIG. 7, and FIG. 9 is an enlarged schematic structural diagram of the area A in FIG. 8. As shown in FIGS. 8 and 9, the electronic candle of the present embodiment includes housing 80, wick member 50, and the above-described LED light. As shown in FIG. 11, the housing 80 has a hollow tubular shape with an opening at the top. The housing 80 may be a square tubular shape, a polygonal tubular shape, a cylindric shape, etc., and the present invention is not limited thereto. In the present embodiment, the housing 80 has cylindric shape to facilitate the manufacturing of the housing 80. It should be noted that the form of the electronic candle shown in FIG. 7 is a flat head type, but the present invention is not limited thereto, and the electronic candle may be in the form such as melting opening type, oblique opening type, crater type, etc.

The inner wall of the housing 80 is fixed with cantilever 81, and the cantilever 81 and the wick member 50 are respectively provided with a swing connection structure and a limiting structure. The swing connection structure includes concave portion 812 and convex portion 521 disposed in the concave portion 812. It can be understood that one of the concave portion 812 or the convex portion 521 is disposed on the cantilever 81, and the other is disposed on the wick member 50, the convex portion 521 and the concave portion 812 move relative to each other, thereby achieving the swing of the wick member 50. The swing of the wick member 50 may be artificially controlled or not artificially controlled, to which the present invention is not limited.

In order to reduce the wear and tear between the convex portion 521 and the concave portion 812, in the present embodiment, the surface of the convex portion 521 that is in contact with the concave portion 812 is a spherical surface, or, the surface of the concave portion 812 that is in contact with the convex portion 521 is a spherical surface.

The limiting structure limits a limiting space, and the wick member 50 swings within the limiting space, which prevents the wick member 50 from swinging excessively, thereby avoiding deviation of the wick member 50 from the illuminated area of the LED light. Moreover, the limiting structure may also prevent the wick member 50 from colliding with other components, thus, preventing the wick member 50 from rebounding or stopping and avoiding unnatural swinging of the wick member 50. It should be understood that the limiting structure may be separately disposed on the wick member 50, or may be separately disposed on the cantilever 81, or may be respectively disposed on the wick member 50 and the cantilever 81, which is not limiting for the present invention.

The LED light is fixed within the opening of the housing 80 and the light emitted by the LED light is at least partially focused by the wick member 50. The electronic candle simulating the flame swing can be obtained by the brightness change of the first light-emitting die 21 and the second light-emitting die 22, and the swing of the wick member 50. It should be understood that the dimming control circuit 30 may be disposed in the opening of the housing 80 or may be disposed outside the housing 80, which is not limited in the present invention.

Figure 3:
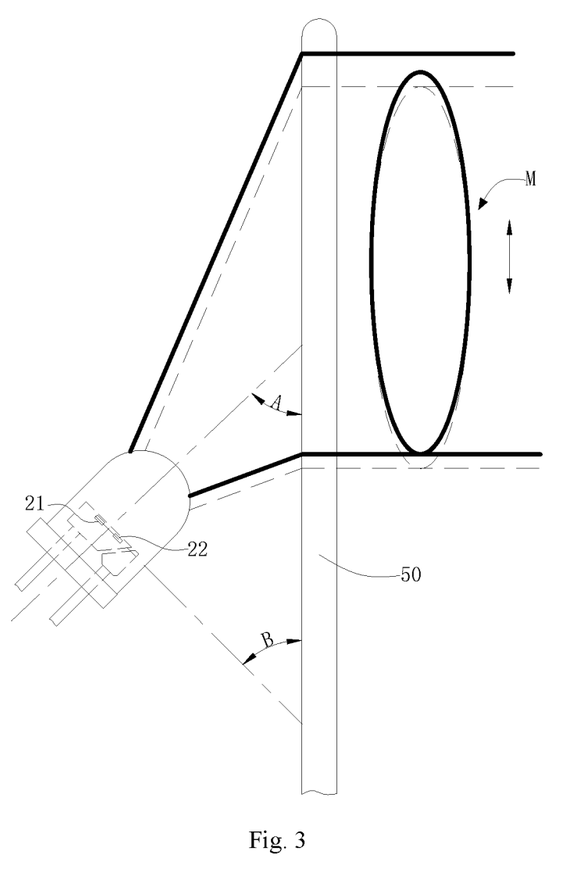
FIG. 3 is a diagram showing an effect of flame swing of the embodiment of the LED light shown in FIG. 1.
Figure 4:
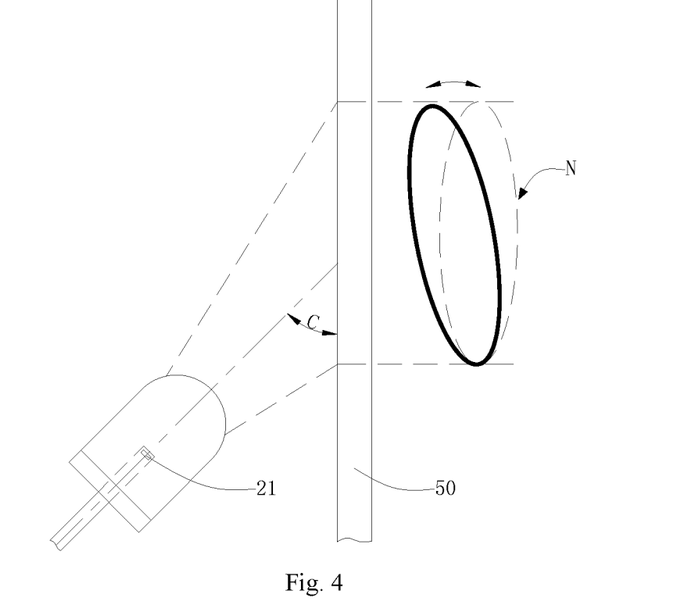
FIG. 4 is a diagram showing an effect of flame swing of another embodiment of the LED light shown in FIG. 1.

As shown in FIG. 3 and FIG. 4, the light emitted by the first light-emitting die 21 and the second light-emitting die 22 may be received by the light receiving action of the wick member 50. When viewed from different directions, the light received may exhibit a flame effect of swinging left and right, or a flame effect of swinging up and down, or a flame effect of swinging left and right with up and down.

Taking the two diagrams showing the effects of flame swing as examples, one embodiment is shown in FIG. 3, the illuminated surface of the wick member 50 is a plane surface, and the LED light is inclined at an angle A with respect to the illuminated surface, and the angle A is preferably less than 90 degrees. The angle between the line connecting the first light-emitting die 21 and the second light-emitting die 22 and the plane of the illuminated surface is B, and the sum of the angle A and the angle B is 90 degrees. The emergent light of the first light-emitting die 21 passes through the heavy line area in FIG. 3 and is displayed on the heavy line area of the illuminated surface. The emergent light of the second light-emitting die 22 passes through the dotted line area in FIG. 3 and is displayed on the dotted line area of the illuminated surface. When the emergent light is projected onto the illuminated surface in this way, a significant flame effect of swinging up and down (shown by M in FIG. 3) can be obtained, and the flame effect is realistic. The other embodiment is shown in FIG. 4, the LED light may be inclined by a certain angle A with respect to the illuminated surface, and the angle A is preferably less than 90 degrees. A line connecting the first light-emitting die 21 and the second light-emitting die 22 is parallel to the illuminated surface. When the first light-emitting die 21 and the second light-emitting die 22 are viewed from the side, the passing areas thereof overlap (shown by a dotted line in FIG. 4). The light emitted by the first light-emitting die 21 is displayed on the heavy line area of the illuminated surface. The light emitted by the second light-emitting die 22 is displayed on the dotted line area of the illuminated surface. When the emergent light is projected onto the emergent surface in this way, a significant flame effect of swinging left and right (shown by N in FIG. 4) may be obtained. Of course, other ways of placing the LED light, after receiving light on the illuminated surface, can obtain other different swinging effects, which herein will not be described in detail.

It is well known that the flame of the core of the wick member 50 is not easily affected by the airflow, so that it does not swing much. However, the flame away from the core of the wick member 50 is easily affected by the air flow, so that it swings violently. In the LED light of the present embodiment, due to the light concentrating action of the light condensing surface 11 of the encapsulant body 10 and the light receiving action of the wick member 50, the closer the illuminated surface of the wick member 50 is to the light-emitting die 20, the less obvious the flame swing effect is. On the other hand, the farther the illuminated surface of the wick member 50 is from the light-emitting die 20, the more obvious the flame swing effect is. Thus, the flame swing effect is substantially the same as the real flame swing effect, and the fidelity thereof is high.

Embodiment 2

On the basis of the embodiment 1, in the present embodiment, the dimming control signals corresponding to the first light-emitting die 21 and the second light-emitting die 22 may be dimming control signals having limited periods, and the dimming control signals may be regular or irregular. The period of the dimming control signals has a certain duration, which may be set as needed, for example, 5-15 s, and preferably, 10 s. For the dimming control signals, the waveforms between the two periods may be the same, and the waveforms between the two periods of the dimming control signals corresponding to the two different light-emitting dies are different. It should be understood that the waveforms being different may mean that the waveforms of the two periods as a whole are not the same. When certain segments of the waveforms in the periods of two dimming control signals are the same and certain segments are different, the waveforms may be considered to be different. It should be understood that the different waveforms may be different in amplitude.

Embodiment 3

On the basis of the embodiment 1 or 2, in the present embodiment, the vertical distances from the first light-emitting die 21 and the second light-emitting die 22 to the top end of the condensing surface 11 are L, and are equal. In this embodiment, the first light-emitting die 21 and the second light-emitting die 22 may be on the same horizontal plane surface. The distance between the first light-emitting die 21 and the second light-emitting die 22 is D. In the present embodiment, the value of D/L is 1/50-3/50. Taking two light-emitting dies having a size of 10×16 mil as an example, the distance D between the first light-emitting die 21 and the second light-emitting die 22 may be between 0.1 mm and 0.3 mm, preferably, 0.2 mm. The vertical distance L from the first light-emitting die 21 and the second light-emitting die 22 to the top end of the condensing surface 11 may be 5±0.3 mm.

Embodiment 4

Figure 5:
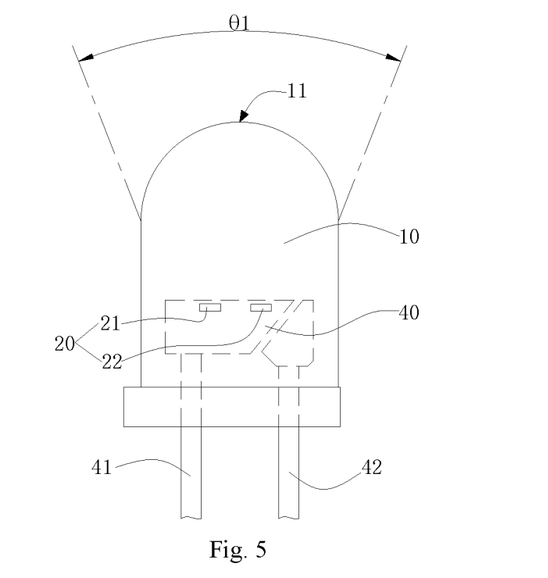
FIG. 5 is a schematic diagram showing the maximum included angle of the output light of a single light-emitting die in the LED light shown in FIG. 1.
Figure 6:
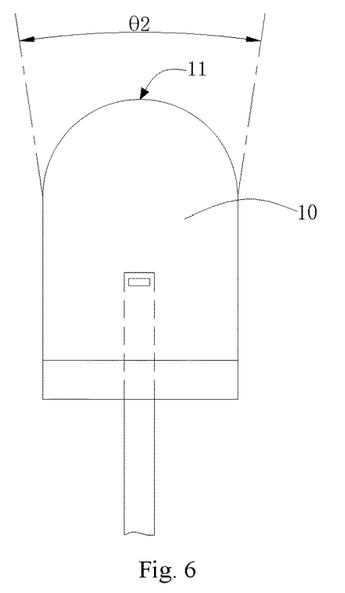
FIG. 6 is a schematic diagram showing the maximum included angle of the output light of a plurality of light-emitting dies in the LED light shown in FIG. 1.

On the basis of any one of the embodiments 1 to 3, in this embodiment, as shown in FIG. 5, the light emitted by the first light-emitting die 21 and the second light-emitting die 22 may be emerged from the light condensing surface 11 of the encapsulant body 10, and the maximum included angle θ1 between the emitted lights is not more than 45°. In another embodiment, as shown in FIG. 6, the light emitted by the at least two light-emitting dies 20 may be emerged from the light condensing surface of the encapsulant body, and the maximum included angle θ2 between the output lights is 10°-45°. A more realistic flame profile may be achieved by controlling the angle of the emergent lights.

Embodiment 5

Figure 10:
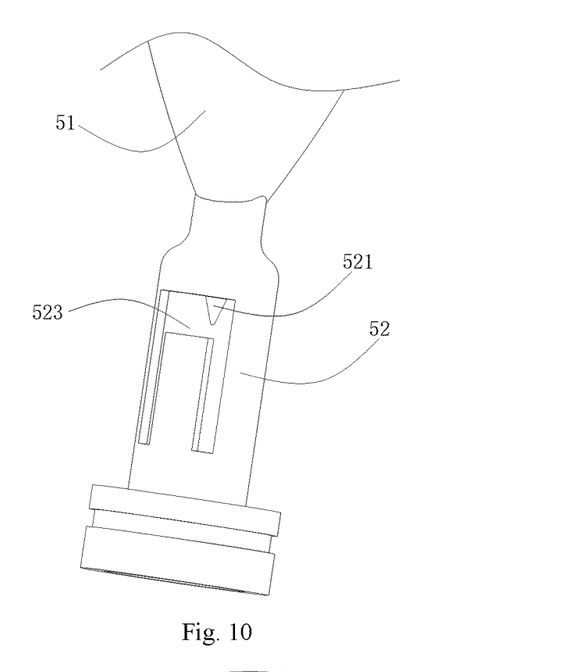
FIG. 10 is a schematic structural diagram of a wick member of the electronic candle shown in FIG. 7.

On the basis of any one of the embodiments 1-4, in the present embodiment, as shown in FIG. 10, the wick member 50 includes flame piece 51 and counterbalance member 52 fixed at the bottom of the flame piece 51. The light emitted by the LED light is at least partially focused by the flame piece 51.

The swing connection structure and the limiting structure are both disposed between the counterbalance member 52 and the cantilever 81. The counterbalance member 52 is disposed such that the center of gravity of the wick member 50 is always on the counterbalance member 52 regardless of how the flame piece 51 swings, so that the wick member will not be stuck or moved.

Embodiment 6

On the basis of the embodiment 5, in the present embodiment, as shown in FIGS. 9 and 10, the counterbalance member 52 has accommodating cavity 522, and the side wall of the accommodating cavity 522 is provided with through hole 523 for the cantilever 81 to be inserted into the accommodating cavity 522. The through hole 523 constitutes the limiting structure. One of the accommodation cavity 522 and the cantilever 81 is provided with the convex portion 521, and the other is provided with the concave portion 812.

Specifically, in the present embodiment, the surface of the bottom end of the counterbalance member 52 has a blind hole, and the space of the blind hole is the accommodation cavity 522, and the through hole 523 penetrates the blind hole from the radial direction of the blind hole. As shown in FIGS. 9-10, the gap between the through hole 523 and the cantilever 81 is the range limited by the limiting structure.

In the present embodiment, the convex portion 521 is disposed in the blind hole of the counterbalance member 52, the convex portion 521 extends from the bottom of the blind hole toward the opening of the blind hole, and the convex portion 521 has a tapered shape of big top and small bottom in order to reduce the contact area between the convex portion 521 and the concave portion 812, improve the swinging flexibility of the wick member 50, and prevent the wick member 50 from being stuck.

One end of the cantilever 81 extends into the accommodation cavity 522, and the top surface of the end is provided with a conical hole, and the conical hole is the concave portion 812. It can be understood that the concave portion 812 may also be a circular hole, a square hole, a polygonal hole, etc., which is not limited in the present invention.

In order to prevent the wick member 50 from falling off from the cantilever 81 by accident, in the present embodiment, the bottom surface of one end of the cantilever 81 extending into the accommodating cavity 522 extends downwardly with limiting convex boss 811.

Embodiment 7

On the basis of the embodiment 5 or 6, in the present embodiment, as shown in FIG. 9, an electromagnetic coil 90 is fixed in the housing 80, and the electromagnetic coil 90 is connected with a magnetic field control circuit in order to cause the electromagnetic coil 90 to generate a magnetic field at intervals; the bottom end of the counterbalance member 52 is fixed with magnet 70 corresponding to the electromagnetic coil 90.

In the present embodiment, the two magnetic poles of the magnet 70 are located in the same vertical plane surface, and two magnetic poles are generated when the electromagnetic coil 90 is energized are located in the same vertical plane surface. The magnetic poles of the electromagnetic coil 90 and the corresponding magnetic poles of the magnets 70 may be set according to actual needs, for example, the magnetic poles may be the same magnetic poles, or the same magnetic poles and the different magnetic poles may be generated at intervals by controlling the circuit board. In the present embodiment, the magnetic poles corresponding to the electromagnetic coil 90 and the magnet 70 are the same magnetic poles. For example, the top of the magnet 70 is the S pole and the bottom is the N pole, then the top of the electromagnetic coil 90 is the S pole and the bottom is the N pole when the electromagnetic coil 90 is energized. After the electromagnetic coil 90 is energized, since the magnetic field generated by the electromagnetic coil 90 and magnetic poles corresponding to the magnet 70 are the same magnetic poles, the magnet 70 and the wick member 50 are moved away from the vertical direction under the action of the magnetic field. When the electromagnetic coil 90 is de-energized, the magnet 70 and the wick member 50 are swung back and forth due to gravity and inertia. The magnetic field control circuit controls the electromagnetic coil 90 to be energized at intervals so that the electromagnetic coil 90 generates magnetic fields at intervals, thereby maintaining the swinging of the magnet 70 and the wick member 50.

The magnetic field control circuit may be disposed in the housing 80 or may be disposed outside the housing 80, which is not limited in the present invention. In the present embodiment, the magnetic field control circuit includes a second control chip, and two ends of the electromagnetic coil 90 are respectively connected to the two pins of the second control chip. Alternatively, one end of the electromagnetic coil 90 is connected to one pin of the second control chip, and the other end of the electromagnetic coil 90 is connected to the battery. The magnetic field control circuit and the dimming control circuit can be fabricated on the same circuit board or on different circuit boards. When the magnetic field control circuit and the dimming control circuit are fabricated on the same circuit board, the first control chip 31 and the second control chip may be the same control chip or different control chips. In the present embodiment, the magnetic field control circuit and the dimming control circuit are fabricated on the same circuit board and controlled by the same control chip. In the present embodiment, the main control circuit board provided with the magnetic field control circuit and the dimming control circuit is disposed outside the housing 80.

In the present embodiment, as shown in FIG. 9, the bottom of the housing 80 is covered with cover plate 100, and a switching circuit board is fixed on the cover plate 100. The LED light and the electromagnetic coil 90 are both fixed on the switching circuit board. The switching circuit board and the main control circuit board are connected by wires, so that the control chip is respectively connected with the LED light and the electromagnetic coil 90.

In the present embodiment, both the main control circuit board and the switching circuit board are provided with connectors. A connecting wire is disposed between the connector of the main control board and the connector of the switching board to facilitate separation of the main control board from the housing 80.

Embodiment 8

On the basis of the embodiment 7, as shown in FIG. 8, in the present embodiment, the bottom of the housing 80 is detachably connected with the supporting rod 110. Specifically, the housing 80 is engaged with the top end of the supporting rod 110. Due to the arrangement of the supporting rod 110, the length of the housing 80 may be shortened, so that the installation of the LED light and the electromagnetic coils 90 may be convenient, and moreover, different series of electronic candles can be produced by making the supporting rods 110 with different lengths.

Embodiment 9

On the basis of the embodiment 8, as shown in FIG. 8, in the present embodiment, the bottom of the supporting rod 110 is detachably connected to the base 120. Specifically, the base 120 is engaged with the bottom of the support rod 110. The arrangement of the base 120 increases the contact area between the supporting rod 110 and the platform on which the electronic candle is placed, thereby preventing the electronic candle from falling over.

In the present embodiment, battery accommodating cavity 121 is arranged on the base 120. A battery for respectively supplying power to the dimming control circuit and the magnetic field control circuit is provided in the battery accommodating cavity 121.

In the present embodiment, as shown in FIGS. 7 and 8, the external surface of the housing 80 is sleeved with decorative casing 60. The decorative casing 60 has a circular tubular shape. The housing 80 is disposed at the top of the decorative casing 60. The base 120 is disposed at the bottom of the decorative casing 60. The main control circuit board is disposed in the decorative casing 60.

The present invention is not limited to the above-described optional embodiments, various other forms of products may be derived by anyone under the inspiration of the present invention. The above-mentioned embodiments are not to be construed as limiting the scope of the present invention. The scope of the present invention should be defined by the scope of the claims, and the specification can be used to interpret the claims.

What is claimed is:

1. An electronic candle, comprising:
   an LED light;
   an encapsulant body, having a light condensing surface;
   at least two light-emitting dies packaged in the encapsulant body and spaced apart from each other, wherein, light emitted by the at least two light-emitting dies as a whole is emitted from the light condensing surface of the encapsulant body;
   a dimming control circuit outputting a varying dimming current to the at least two light-emitting dies according to dimming control signals, and the dimming control signals corresponding to the at least two light-emitting dies are different;
   a housing, having an opening at a top end, wherein a cantilever is fixed in the opening of the housing;
   a wick member, wherein a swing connection structure and a limiting structure are respectively disposed between the wick member and the cantilever, the swing connection structure comprises a concave portion and a convex portion, wherein the convex portion is disposed on the wick member and disposed in the concave portion, and the wick member swings within a range limited by the limiting structure; and
   the LED light is fixed within the opening of the housing, and light emitted by the LED light is at least partially focused by the wick member.

2. The electronic candle of claim 1, wherein the dimming control signal is a periodic control signal; and wherein,
   the dimming control signal is an irregular dimming control signal during a period of the dimming control signal; or,
   the dimming control signal is a regular dimming control signal during a period of the dimming control signal.

3. The electronic candle of claim 1, wherein a vertical distance of each of the light-emitting dies from the top end of the light condensing surface is equal.

4. The electronic candle of claim 1, wherein the wick member comprises:
   a flame piece, the light emitted by the LED light is at least partially focused by the flame piece; and a counterbalance member, fixedly connected to a bottom end of the flame piece, wherein the swing connection structure and the limiting structure are disposed between the counterbalance member and the cantilever.

5. The electronic candle of claim 4, wherein the counterbalance member has an accommodating cavity, and a side wall of the accommodating cavity is provided with a through hole for the cantilever to insert into the accommodating cavity; the through hole constitutes the limiting structure, one of the accommodating cavity and the cantilever is provided with the convex portion, and the other is provided with the concave portion.

6. The electronic candle of claim 4, wherein an electromagnetic coil is fixed in the housing, and the electromagnetic coil is connected with a magnetic field control circuit to cause the electromagnetic coil to generate a magnetic field at intervals; and a bottom end of the counterbalance member is fixed with a magnet corresponding to the electromagnetic coil.

7. The electronic candle of claim 6, wherein a bottom end of the housing is connected to a supporting rod in a detachable manner.

8. The electronic candle of claim 7, wherein a base is fixed on a bottom of the supporting rod, and the base has a battery accommodating cavity; a battery for respectively supplying power to the dimming control circuit and the magnetic field control circuit is provided in the battery accommodating cavity.

9. The electronic candle of claim 3, wherein the dimming control signal is a periodic control signal; and wherein, the dimming control signal is an irregular dimming control signal during a period of the dimming control signal; or, the dimming control signal is a regular dimming control signal during a period of the dimming control signal.

10. The electronic candle of claim 4, wherein a vertical distance of each of the light-emitting dies from the top end of the light condensing surface is equal.

11. The electronic candle of claim 5, wherein an electromagnetic coil is fixed in the housing, and the electromagnetic coil is connected with a magnetic field control circuit to cause the electromagnetic coil to generate a magnetic field at intervals; and a bottom end of the counterbalance member is fixed with a magnet corresponding to the electromagnetic coil.

12. The electronic candle of claim 11, wherein a bottom end of the housing is connected to a supporting rod in a detachable manner.

13. The electronic candle of claim 12, wherein a base is fixed on a bottom of the supporting rod, and the base has a battery accommodating cavity; a battery for respectively supplying power to the dimming control circuit and the magnetic field control circuit is provided in the battery accommodating cavity.

14. The electronic candle of claim 1, wherein a bottom surface of one end of the cantilever extends into an accommodating cavity.

15. The electronic candle of claim 1, wherein a bottom surface of one end of the cantilever has a convex boss.

16. The electronic candle of claim 3, wherein a ratio of a distance of the spaced apart of the at least two light-emitting dies and the vertical distance is in a range of 1/50-3/50.

17. The electronic candle of claim 1, wherein the convex portion has a tapered shape.

18. The electronic candle of claim 17, wherein the tapered shape has a big top and a small bottom.

* * * * *